(12) United States Patent
Kaneko et al.

(10) Patent No.: US 10,832,889 B2
(45) Date of Patent: Nov. 10, 2020

(54) CHARGED PARTICLE BEAM DEVICE

(71) Applicant: Hitachi High-Technologies Corporation, Tokyo (JP)

(72) Inventors: Asako Kaneko, Tokyo (JP); Hisayuki Takasu, Tokyo (JP); Toru Iwaya, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/320,525

(22) PCT Filed: Aug. 9, 2016

(86) PCT No.: PCT/JP2016/073414
§ 371 (c)(1),
(2) Date: Jan. 25, 2019

(87) PCT Pub. No.: WO2018/029778
PCT Pub. Date: Feb. 15, 2018

(65) Prior Publication Data
US 2019/0272973 A1 Sep. 5, 2019

(51) Int. Cl.
*H01J 37/20* (2006.01)
*H01J 37/09* (2006.01)
(Continued)

(52) U.S. Cl.
CPC .............. *H01J 37/20* (2013.01); *H01J 37/09* (2013.01); *H01J 37/30* (2013.01);
(Continued)

(58) Field of Classification Search
CPC ........ H01J 37/20; H01J 37/30; H01J 37/3053; H01J 37/09; H01J 2237/20214;
(Continued)

(56) References Cited

U.S. PATENT DOCUMENTS

2005/0035306 A1 2/2005 Iwasaki
2005/0116182 A1* 6/2005 Tanaka .................... H01J 37/28
250/492.1

(Continued)

FOREIGN PATENT DOCUMENTS

JP  03-36285 A  2/1991
JP  2004071486 A  3/2004
(Continued)

OTHER PUBLICATIONS

International Search Report of PCT/JP2016/073414 dated Oct. 25, 2016.
(Continued)

*Primary Examiner* — Michael Maskell
(74) *Attorney, Agent, or Firm* — Mattingly & Malur, PC

(57) ABSTRACT

A charged particle beam device that can improve machining position precision in section processing using a shielding plate is provided. The invention is directed to a charged particle beam device including: an ion source (101); a sample stand (106) on which a sample (107) is mounted; a shielding plate (108) placed so that a portion of the sample (107) is exposed when seen from the ion source (101); and tilt units (123, 124) that tilt the sample (107) and the shielding plate (108) relative to the irradiation direction of an ion beam (102) from the ion source (101) to the sample (107).

11 Claims, 14 Drawing Sheets

(51) Int. Cl.
*H01J 37/305* (2006.01)
*H01J 37/30* (2006.01)

(52) U.S. Cl.
CPC ... *H01J 37/3053* (2013.01); *H01J 2237/0262* (2013.01); *H01J 2237/20207* (2013.01); *H01J 2237/20214* (2013.01)

(58) Field of Classification Search
CPC ..... H01J 2237/20207; H01J 2237/0262; H01J 2237/31749; H01J 37/3056; H01J 2237/026; H01J 37/165
USPC ............................. 250/492.1–492.3, 453.11
See application file for complete search history.

(56) References Cited

U.S. PATENT DOCUMENTS

| | | | |
|---|---|---|---|
| 2012/0080406 A1 | 4/2012 | Boguslavsky et al. | |
| 2012/0085939 A1* | 4/2012 | Coyle | G01N 1/32 250/492.3 |
| 2013/0220806 A1* | 8/2013 | Iwaya | H01J 37/3005 204/298.32 |
| 2013/0228702 A1* | 9/2013 | Coyle | G01N 1/32 250/453.11 |
| 2013/0240353 A1* | 9/2013 | Watanabe | H01J 37/20 204/298.36 |
| 2015/0228446 A1* | 8/2015 | Breymesser | H01L 29/861 257/147 |
| 2016/0163508 A1* | 6/2016 | Iwaya | H01J 37/3005 204/192.33 |
| 2017/0047198 A1* | 2/2017 | Horinouchi | G01N 1/32 |

FOREIGN PATENT DOCUMENTS

| | | |
|---|---|---|
| JP | 2012-018164 A | 1/2012 |
| JP | 2013-527435 A | 6/2013 |
| JP | 2013527435 A | 6/2013 |
| KR | 1020130086046 A | 7/2013 |
| WO | 2011130100 A2 | 10/2011 |
| WO | 2012/060416 A1 | 5/2012 |

OTHER PUBLICATIONS

Korean Office Action received in corresponding Korean Application No. 10-2019-7002085 dated Jul. 8, 2020.

* cited by examiner

CHARGED PARTICLE BEAM DEVICE

TECHNICAL FIELD

The present invention relates to a charged particle beam device.

BACKGROUND ART

An ion milling device which is one of charged particle beam devices is a sample pretreatment device such as a scanning electron microscope (SEM) or a transmission electron microscope (TEM), and is used as a device for manufacturing the section and plane of a sample in a wide range of fields. This is a device that irradiates a sample with accelerated argon ions and scrapes the sample using a sputtering phenomenon in which atoms of a sample fly from the surface of the sample, and generally there are a planar milling method and a section milling method.

The former planar milling method is a method of scraping a sample by directly irradiating a sample surface with ion beams that do not converge from an ion source, and has a feature that a wide range of the sample surface can be scraped off as described in PTL 1. On the other hand, in the latter section milling method, a shielding plate is disposed between an ion source and a sample, and the sample protrudes from the shielding plate by about several µm to 200 µm. Thus, it is possible to smoothly scrape the section of the sample along the end surface of the shielding plate by irradiating a part of the sample protruding from the shielding plate with the ion beam.

CITATION LIST

Patent Literature

PTL 1: JP-A-3-36285

SUMMARY OF INVENTION

Technical Problem

In recent years, there is a need to process materials with low sputtering yield such as ceramics and superhard materials in a wide range and in short time, and it is necessary to use an ion source corresponding to a high milling rate. Further, according to miniaturization of the sample, it is required to produce a wide section of a fine structure, and in general, a focused ion beam (FIB) is known as a section producing method for narrow samples, but it has difficulty in processing a wide area and needs much time for processing. Thus, a section milling method for producing section of a fine structure using a shielding plate is expected.

Then, the inventors have performed section ion milling on materials with low sputtering yield such as ceramics and superhard materials, by using an ion source of high energy (ions applied with a high acceleration voltage). As a result, it has been found that although the shielding plate is disposed at the intended position on the sample, the processed surface is formed in an overhang shape from the end surface of the shielding plate, for example, about several µm, and the sample processed surface along the end surface of the shielding plate cannot be obtained.

An object of the present invention is to provide a charged particle beam device that can improve processing position accuracy in section processing using a shielding plate.

Solution to Problem

As an embodiment to achieve the object, there is provided a charged particle beam device including: an ion source; a sample stand on which a sample is placed; a shielding plate disposed such that a portion of the sample is exposed when seen from the ion source; and a tilt unit that relatively tilts the sample and the shielding plate in an irradiation direction of an ion beam from the ion source to the sample.

Advantageous Effects of Invention

According to the present invention, it is possible to provide a charged particle beam device capable of improving processing position accuracy in section processing using a shielding plate.

DESCRIPTION OF EMBODIMENTS

The inventors have further studied the cause of the newly found deterioration of processing position accuracy. As a result, it has been found that the scattering of the ion beam to the inside of the sample is increased during the irradiation of the ion beam, the sample processed surface along the end surface of the shielding plate cannot be obtained due to formation of an amorphous layer and physical sputtering in a region shielded by the shielding plate.

The present invention has been made from this new knowledge, which makes it possible to perform flat processing along the end surface of the shielding plate, by adding a means for changing the incident angle of the sample, in consideration of the irradiation (incidence) angle of ions to be scattered in the inside of the sample in the vicinity of the end surface of the shielding plate that shields ion beams. In addition, it is possible to prevent the surface below the mask from being milled, by performing irradiation of ion beams while finely moving the shielding plate.

This makes it possible to avoid the influence of the sputtering phenomenon caused by the ions scattered in the inside of the sample on the processed surface, in the section ion milling using the shielding plate, and to obtain a smooth sample section along the end surface of the shielding plate, whereby the processing position accuracy of the device is improved.

Hereinafter, the present invention will be described in the following examples with reference to the drawings. Although an ion milling device will be described as a charged particle beam device, application to other apparatus using ions is also possible.

Embodiment 1

Figure 1:
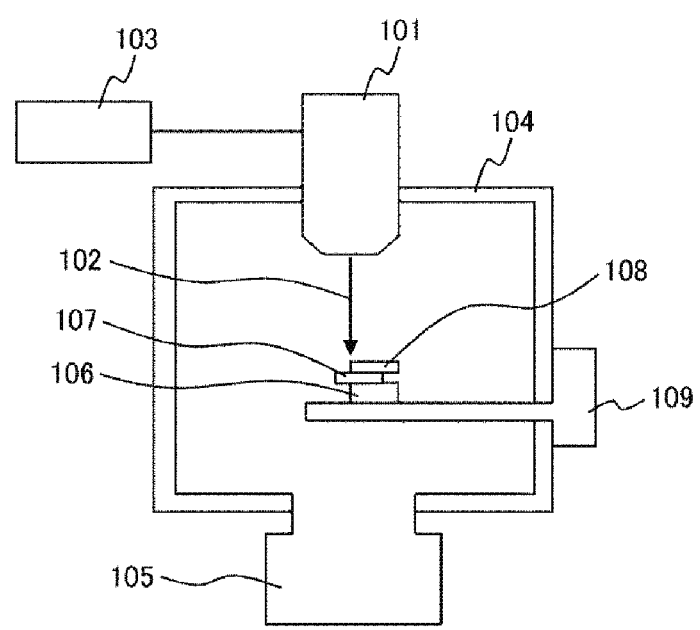
FIG. 1 is a schematic diagram of an ion milling device according to Embodiment 1.

FIG. 1 illustrates the configuration of an ion milling device in which a shielding plate 108 is installed on the upper surface of a sample 107, the sample is irradiated with accelerated ion beams 102, and the cross section of a projecting portion of the sample is processed by utilizing a sputtering phenomenon of ions. The current density of argon ions in an argon ion source 101 is controlled by an ion source control unit 103. The interior of a vacuum chamber 104 can be evacuated or become an atmospheric state by controlling a vacuum evacuation system 105, and this state can be maintained.

The sample 107 is fixed on a sample stand 106. Further, when the interior of the vacuum chamber 104 is opened to the atmosphere, a sample stage 109 can be drawn out of the vacuum chamber 104. The sample stand 106 on which the sample 107 is fixed can be fixed on the sample stage 109. The sample 107 and the shielding plate 108 are independently fixed to be movable, and by irradiating the ion beam 102 emitted from the ion source 101, a part protruding from the shielding plate 108 of the sample 107 as seen from the ion source can be processed. The present ion milling device includes a tilt axis control section, a shielding plate fine movement mechanism, and the like which will be described later.

Figure 2A:
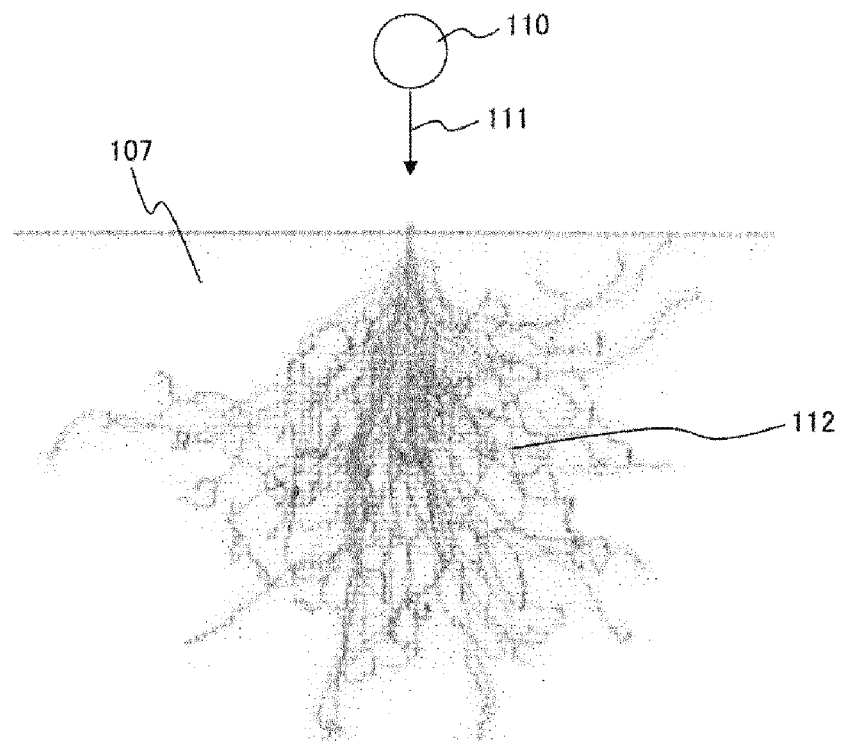
FIG. 2A is an image illustrating an example of Monte Carlo simulation of a scene in which a sample is irradiated with highly accelerated ion beams and the ion beams are scattered in the sample.
Figure 2B:
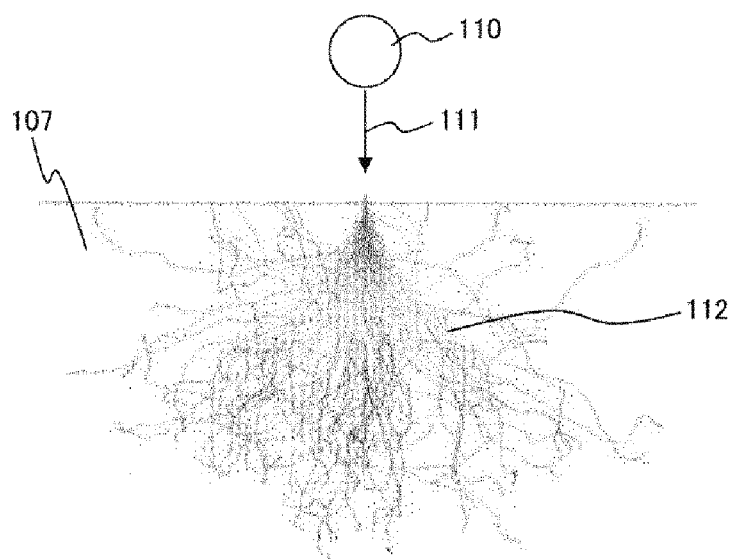
FIG. 2B is an image illustrating an example of Monte Carlo simulation of a scene in which a sample is irradiated with lowly accelerated ion beams and the ion beams are scattered in the sample.

FIGS. 2A and 2B illustrate scattered ions 112 inside the sample 107 by Monte Carlo simulation when the sample 107 is irradiated with the argon ions 110 along an argon ion incidence direction 111. FIG. 2A illustrates a case where the sample 107 is irradiated with high acceleration ions and FIG. 2B illustrates a case of low acceleration ions. Here, it is understood that the scattering of ions inside the sample 107 is larger in FIG. 2A in which high acceleration ions are irradiated.

Figure 3A:
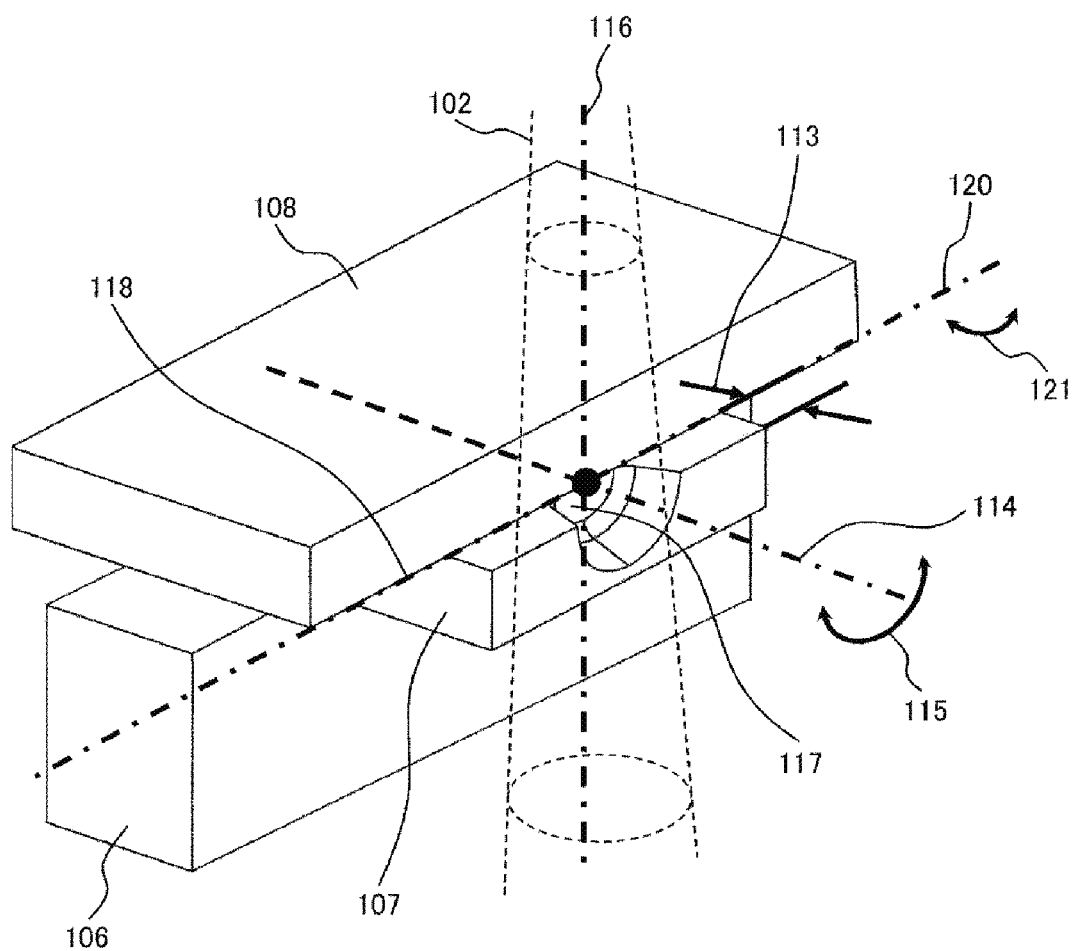
FIG. 3A is a schematic bird's-eye view of a main part for explaining section ion milling of the sample.
Figure 3B:
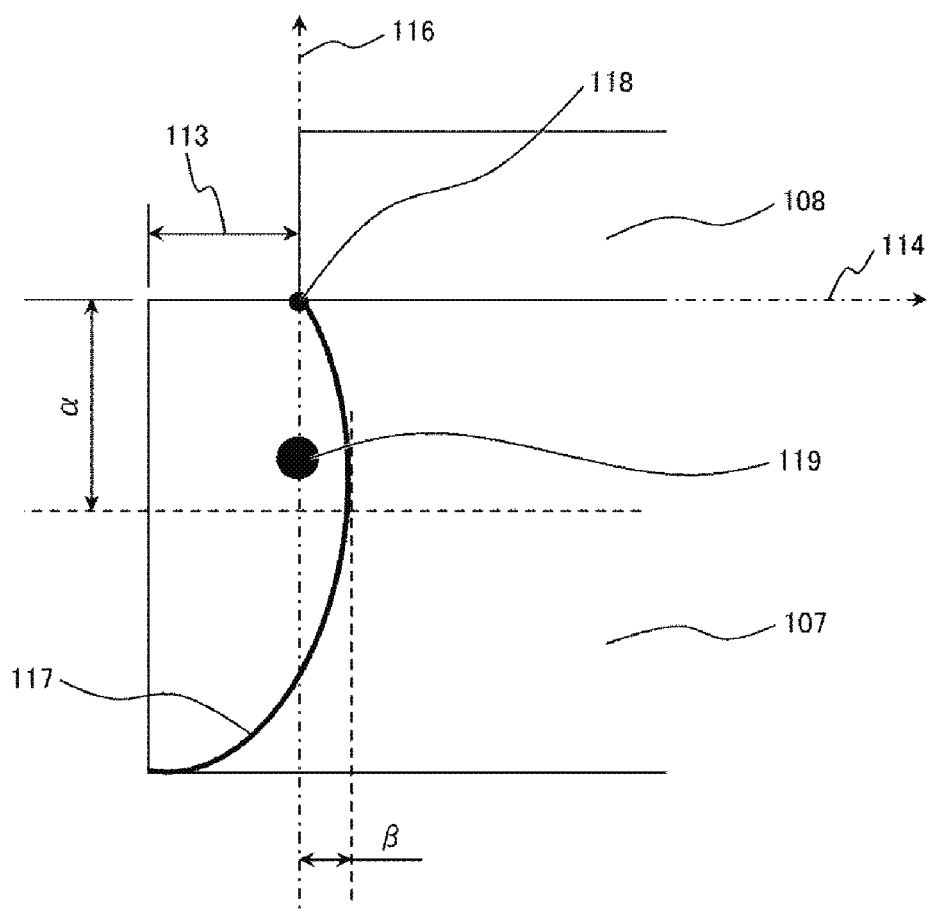
FIG. 3B is a schematic sectional view of the sample illustrated in FIG. 3A, as viewed from the side.

FIG. 3A is a schematic bird's-eye view of a main part for explaining section ion milling of the sample, and FIG. 3B is a schematic cross-sectional view of the sample illustrated in FIG. 3A, as viewed from the side. As illustrated in FIG. 3A, in the section milling, the user presets a protrusion amount 113 of the sample 107 from the shielding plate 108 before processing, and the sample 107 is irradiated with the ion beams 102. For convenience, the protrusion amount 113 is demonstrated larger in comparison with the thickness of the shielding plate 108. In this case, the shielding plate 108, the sample 107, and the sample stand 106 are in a swing direction 115 while having any angle on the left and right along with the swing axis 114, but the beam center 116 of the ion beam 102 is set at a position perpendicular to the swing axis 114. Therefore, the milling surface 117 of the sample is formed in a bilaterally symmetric Gaussian distribution shape along the end portion 118 of the shielding plate around a beam center 116 or a swing axis 114.

However, in the section processing performed in the related art, as illustrated in FIG. 3B, the ion beam 102 is scattered inside the sample 107, and the milling surface 117 is not formed perpendicular to the shielding plate 108. In the irradiation of high acceleration ions as illustrated in FIGS. 2A and 2B, the amount of scattered ions 112 inside the sample 107 increases and enters the lower portion of the shielding plate, so the milling surface 117 becomes more curved.

For example, when the protrusion amount 113 of the sample 107 from the shielding plate 108 is set to about 50 μm, and the sample 107 is irradiated with the ion beam 102 with the acceleration voltage of 6 kV, as illustrated in FIG. 3B, the milling surface 117 is formed inside the end portion 118 of the shielding plate by the maximum β (about 5 μm) at the lower portion of the contact surface of the shielding plate 108 and the upper part of the sample 107 by α (about 400 μm). If the milling surface 117 is formed to be curved inwardly of the end portion 118 of the shielding plate in this way, when producing the central section of a fine structure 119 above or inside the sample, there is a possibility that an accurate central section may not be produced or the fine structure 119 itself may be scraped off. There is also a method of processing the sample 107 by setting the acceleration voltage of the ion beam 102 at a low acceleration, but the processing time becomes longer.

Figure 3C:
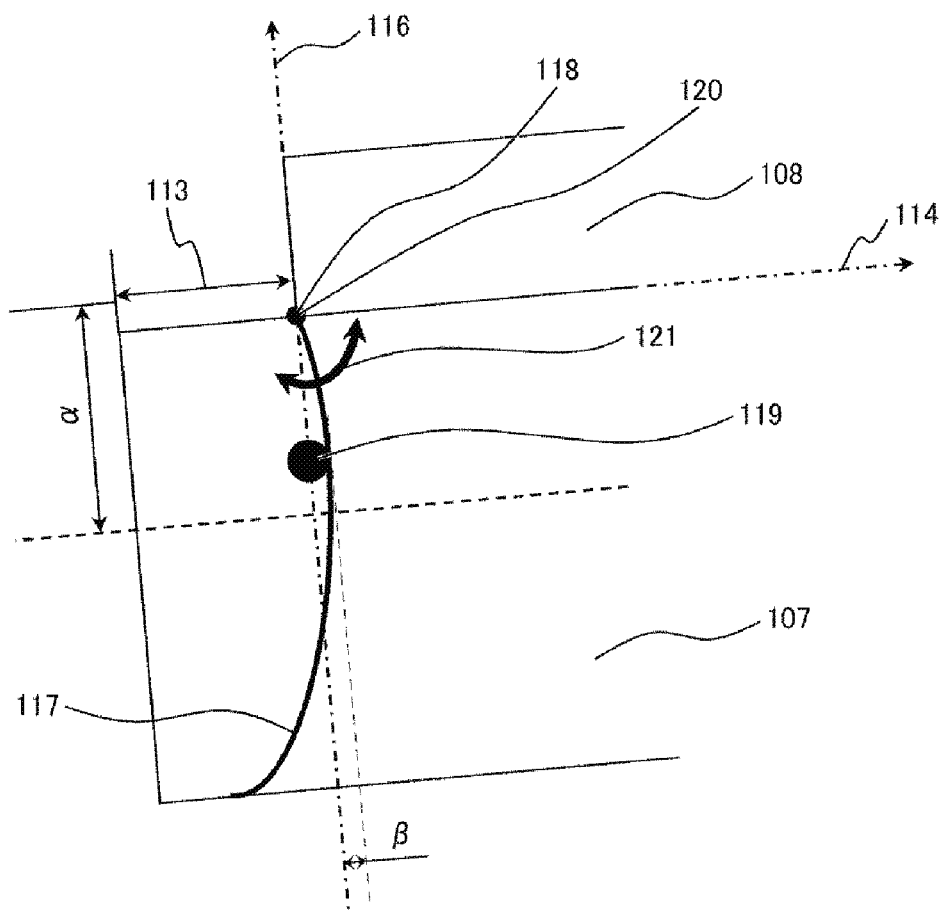
FIG. 3C is a schematic sectional view of the sample when the sample is tilted and subjected to ion milling using the ion milling device illustrated in FIG. 1, as viewed from the side.

Therefore, in the present embodiment, as illustrated in FIG. 3C, since the tilt axis 120 is provided along the end portion 118 of the shielding plate to change the angle of the ion beam 102 entering the sample 107, It is possible to form the milling surface 117 perpendicular to the shielding plate 108 in a short time using the high acceleration ion beam 102. At this time, the sample, the shielding plate and the like are tilted in a direction in which the sample is masked by the shielding plate with respect to the ion beam around the tilt axis. Reference numeral 121 denotes a tilt driving direction.

On the other hand, in the ion milling device, the ion beam 102 emitted from the ion source 101 spreads broadly without being subjected to the converging action and is applied to the sample 107. However, when the acceleration voltage of the ion beam 102 is changed, the position of the beam center 116 is changed, and it is difficult to control the beam center 116 perpendicularly to the swing axis 114, such as in the case where the acceleration voltage is changed during processing.

Generally, the beam center 116 of the ion beam 102 has the highest ion density, and the processing speed is highest at the position of the sample 107 processed at the beam center 116. However, when the beam center 116 changes as described above, a problem of prolonged processing time due to a decrease in a processing speed occurs.

Figure 3D:
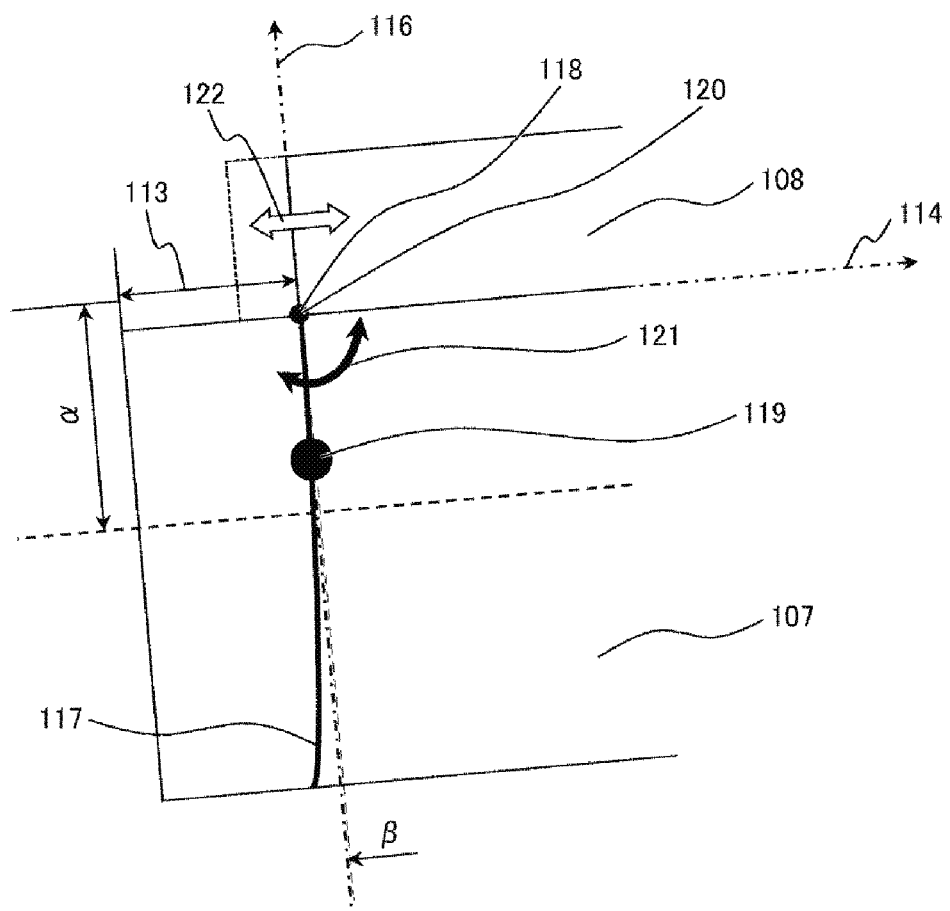
FIG. 3D is a schematic sectional view of the sample when a shielding plate is finely moved, and the sample is tilted and subjected to ion milling using the ion milling device illustrated in FIG. 1, as viewed from the side.

Therefore, as illustrated in FIG. 3D, by providing a mechanism capable of fine movement 122 of the shielding plate according to the acceleration voltage of the ion beam 102, the beam center 116 is always set at the end portion 118 of the shielding plate, and thus it is possible to solve the above-described problem. Reference numeral 121 denotes a tilt driving direction.

Figure 4A:
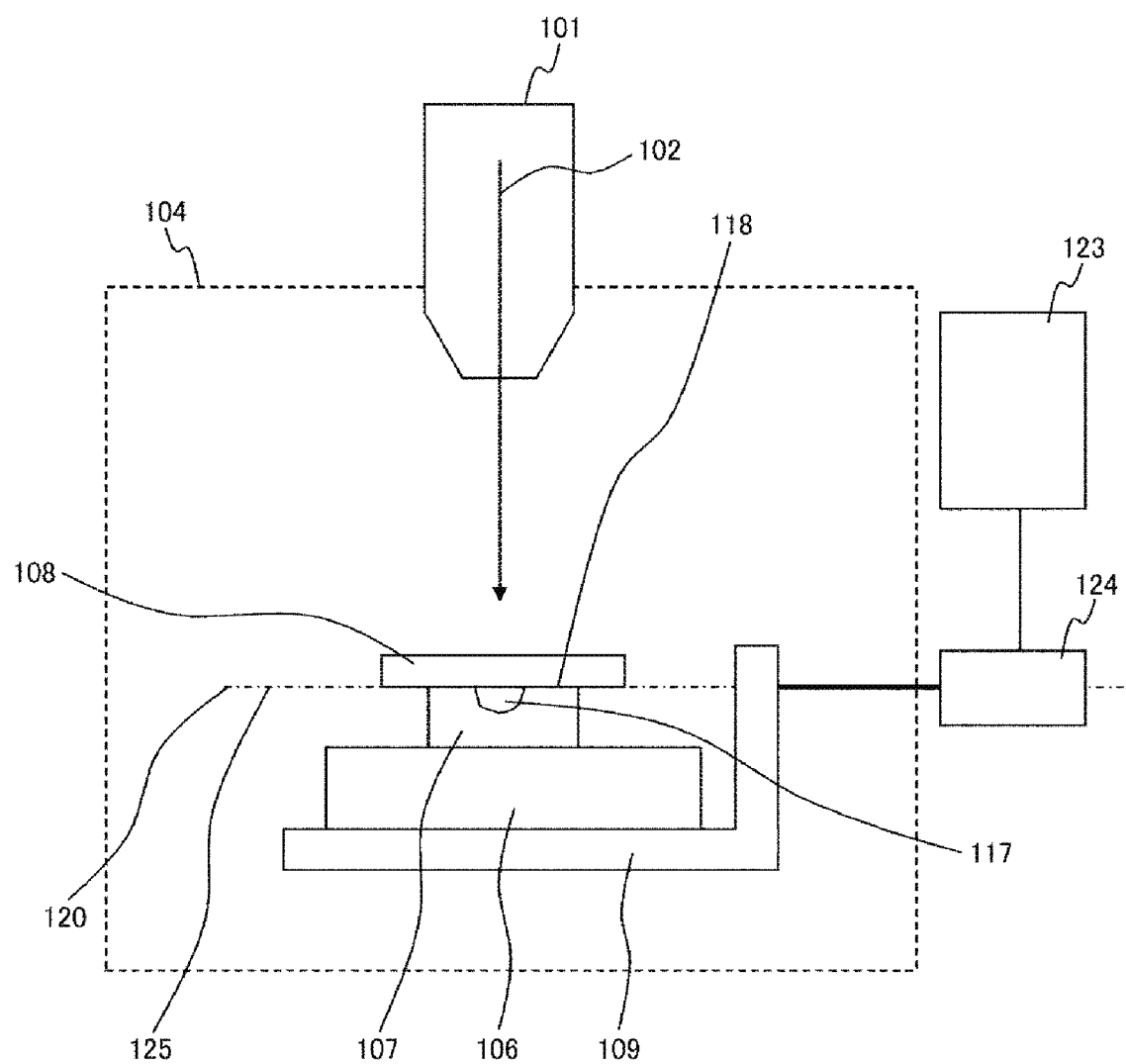
FIG. 4A is a schematic sectional view of a main part for explaining a tilt axis, in the ion milling device illustrated in FIG. 1.

FIG. 4A is a schematic sectional view of a main part for explaining a tilt axis, in the ion milling device illustrated in FIG. 1. The shielding plate 108, the sample 107, the sample stand 106, and the sample stage 109 are disposed inside the vacuum chamber 104, the sample stage 109 is connected to the motor A (a part of the tilt unit) 124 disposed outside the vacuum chamber 104, and the motor A 124 is connected to a tilt control unit (a part of the tilt unit) 123. Further, the sample 107 is irradiated with the ion beam 102 emitted from the ion source 101, and the milling surface 117 having a Gaussian distribution is formed on the sample 107.

Any angle is set by the tilt control unit 123, and by operating the motor A 124, the sample stage 109 on which the shielding plate 108, the sample 107, and the sample stand 106 are placed is tilted around the rotation center axis 125 of the motor A, that is, the tilt axis 120. By tilting the sample 107 as described above, the incident angle of the ion beam 102 applied to the sample 107 is changed. In the present embodiment, the tilt angle is variable using the motor A or the like, but a tilt unit can also be formed using a member that can be fixed at a predetermined tilt angle.

Figure 4B:
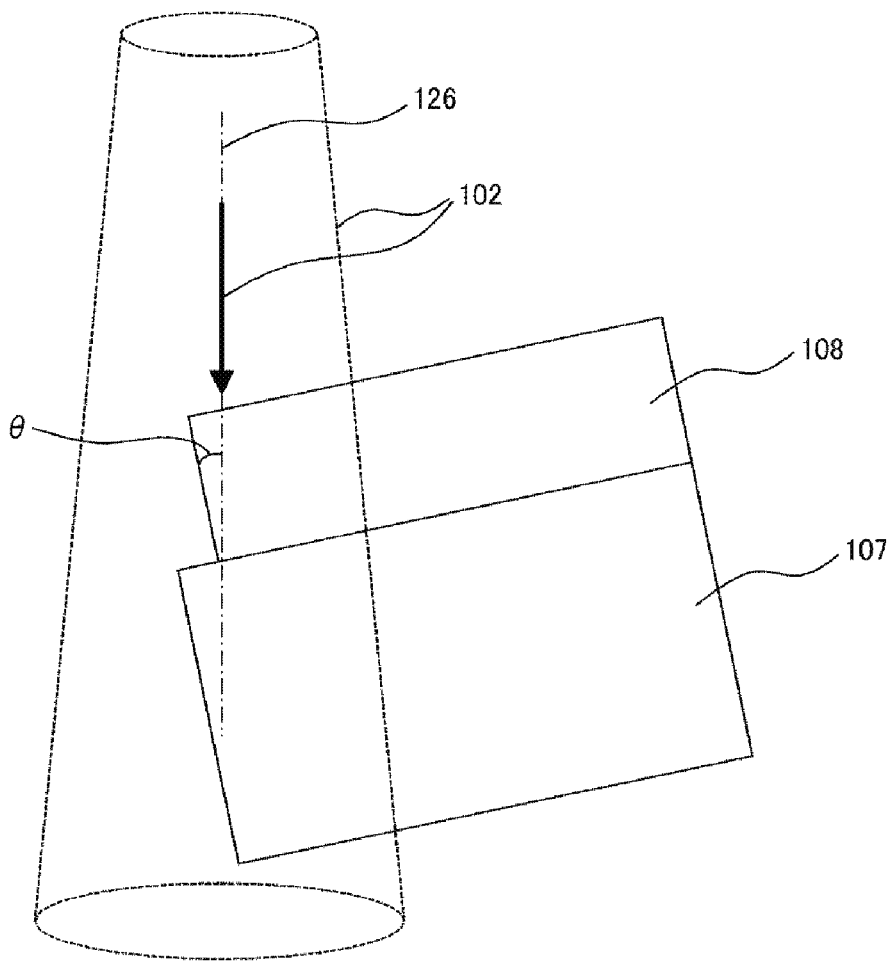
FIG. 4B is a schematic sectional view (partial bird's-eye view) for explaining a tilt angle of the sample with respect to an irradiation direction of an ion beam.

FIG. 4B is a schematic diagram in a case where the sample 107 and the shielding plate 108 are tilted using the tilt axis 120. At this time, the sample, the shielding plate and the like are tilted in a direction in which the sample is masked by the shielding plate with respect to the tilt axis set at the end of the shielding plate so as to intersect with the ion beam and be orthogonal to the swing axis. That is, by setting the sample tilt angle θ on the side of the shielding plate 108 with respect to the ion source center 126, it is possible to reduce the scattered ions 112 inside the sample 107 immediately below the shielding plate 108. Therefore, the problem that the milling surface 117 illustrated in FIG. 3B is not formed perpendicular to the shielding plate 108 can be solved. It is desirable that the sample tilt angle θ is set to be greater than 0° and equal to or less than 10°. The value β can be reduced by setting the tilt angle to be greater than 0°, and a section at a desired position can be obtained by setting the tilt angle to be equal to or less than 10°.

Figure 5:
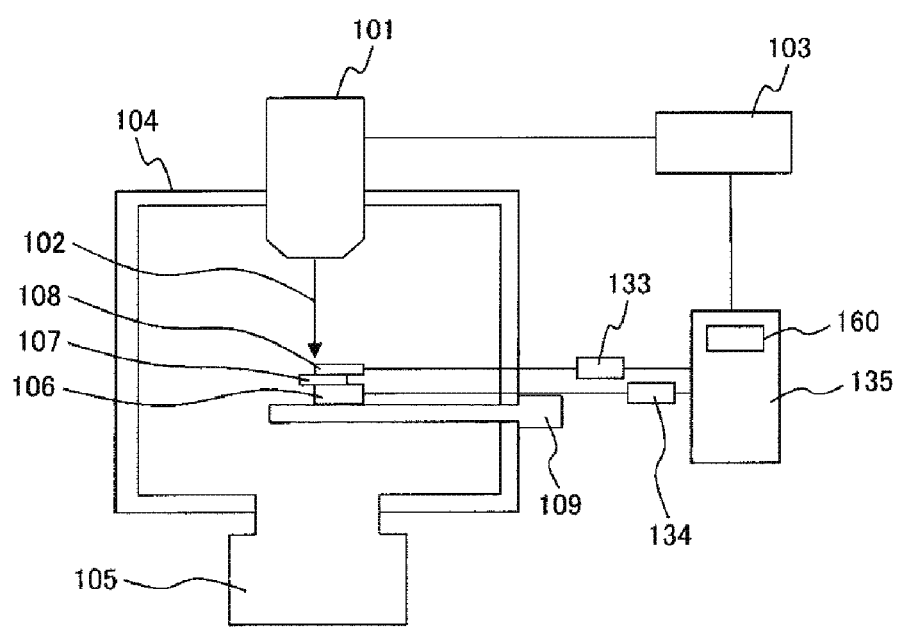
FIG. 5 is a schematic overall sectional view of the ion milling device having a function of adjusting a processing position of the shielding plate and/or the sample according to Embodiment 1.

FIG. 5 is a schematic overall sectional view of an ion milling device having a function of adjusting a processing position of a shielding plate and/or a sample. The interior of the vacuum chamber 104 is maintained in a vacuum state by the vacuum evacuation system 105, and is in a state where the ion beam 102 can be emitted from the ion source 101 at any time by the ion source control unit 103. Further, the shielding plate 108, the sample 107, the sample stand 106, and the sample stage 109 are disposed inside the vacuum chamber 104, and a signal is transmitted from the ion source control unit 103 to the shielding plate and/or sample fine movement mechanism control unit 135. The motor C 133 is operated under the control of the shielding plate and/or sample stand fine movement mechanism control unit 135, and the position of the shielding plate 108 can be controlled from the outside of the vacuum chamber 104.

Similarly, the motor D 134 is operated under the control of the shielding plate and/or the sample stand fine movement mechanism control unit 135, and the position of the sample stand 106 can be controlled from outside the vacuum chamber 104. From this, the energy of the ion beam 102 emitted from the ion source 101 and the positions of the shielding plate 108 and the sample stand 106 are controlled from outside the vacuum chamber 104 by the user, according to the acceleration voltage instructed by the ion source control unit 103.

At this time, for example, in the shielding plate and/or sample stand fine movement mechanism control unit 135, the relationship between the energy of the ion beam previously stored in the internal memory 160 and the position of the sample stand with respect to the shielding plate is used, and the installation position of the shielding plate with respect to the sample is automatically controlled. The memory 160 may be provided outside the shielding plate and/or sample stand fine movement mechanism control unit 135. Alternatively, it is possible to adjust the installation position of the shielding plate with respect to the sample accurately and manually, by adjusting the positions of the shielding plate 108 and/or the sample stand 106 based on information obtained by a camera, a microscope, or a monitor installed in a vacuum chamber, or a mechanism combining them.

Figure 6:
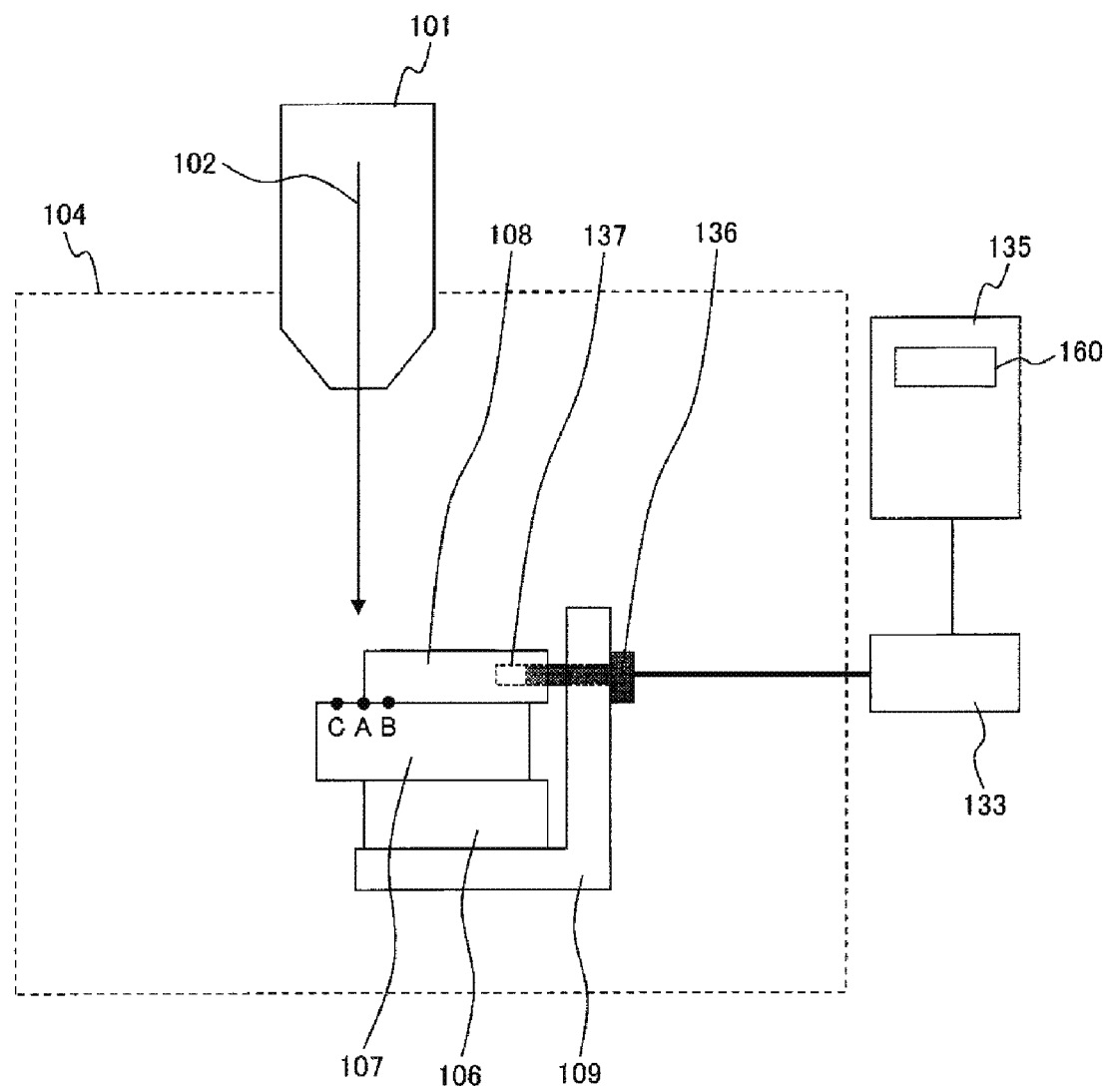
FIG. 6 is a schematic sectional view of a main part of the ion milling device illustrating an example of processing position adjustment of the shielding plate, according to Embodiment 1.

FIG. 6 is a schematic sectional view of a main part of an ion milling device illustrating an example of processing position adjustment of the shielding plate. The shielding plate 108, the sample 107, the sample stand 106, and the sample stage 109 are disposed inside the vacuum chamber 104. Further, a shielding plate female thread portion 137 is provided on the shielding plate 108, and is connected to the sample stage 109 and a screw A 136. The position of the shielding plate 108 can be controlled, by a motor C 133 being operated under the control of a shielding plate and/or sample stand fine movement mechanism control unit 135 and the screw A 136 being rotated.

For example, when the shielding plate 108 is initially adjusted to the processing position A illustrated on the sample 107, the energy of the ion beam 102 emitted from the ion source 101 is varied, and when the center of the ion beam 102 is changed to B on the sample 107 during processing of the sample 107, when the processing position is intentionally adjusted by the user, or the like, the motor C 133 adjusts the position of the shielding plate 108 by being rotated clockwise to control the screw A 136.

For the same reason as above, when the center of the ion beam 102 is changed to C on the sample during processing of the sample 107, when the processing position is intentionally adjusted by the user, or the like, the motor C 133 adjusts the position of the shielding plate 108 by being rotated counterclockwise to control the screw A 136. Further, it is possible to precisely adjust the positions of the shielding plate 108 and the sample stand 106, using a camera, a microscope, or a monitor installed in a vacuum chamber, or a mechanism combining them.

Figure 7:
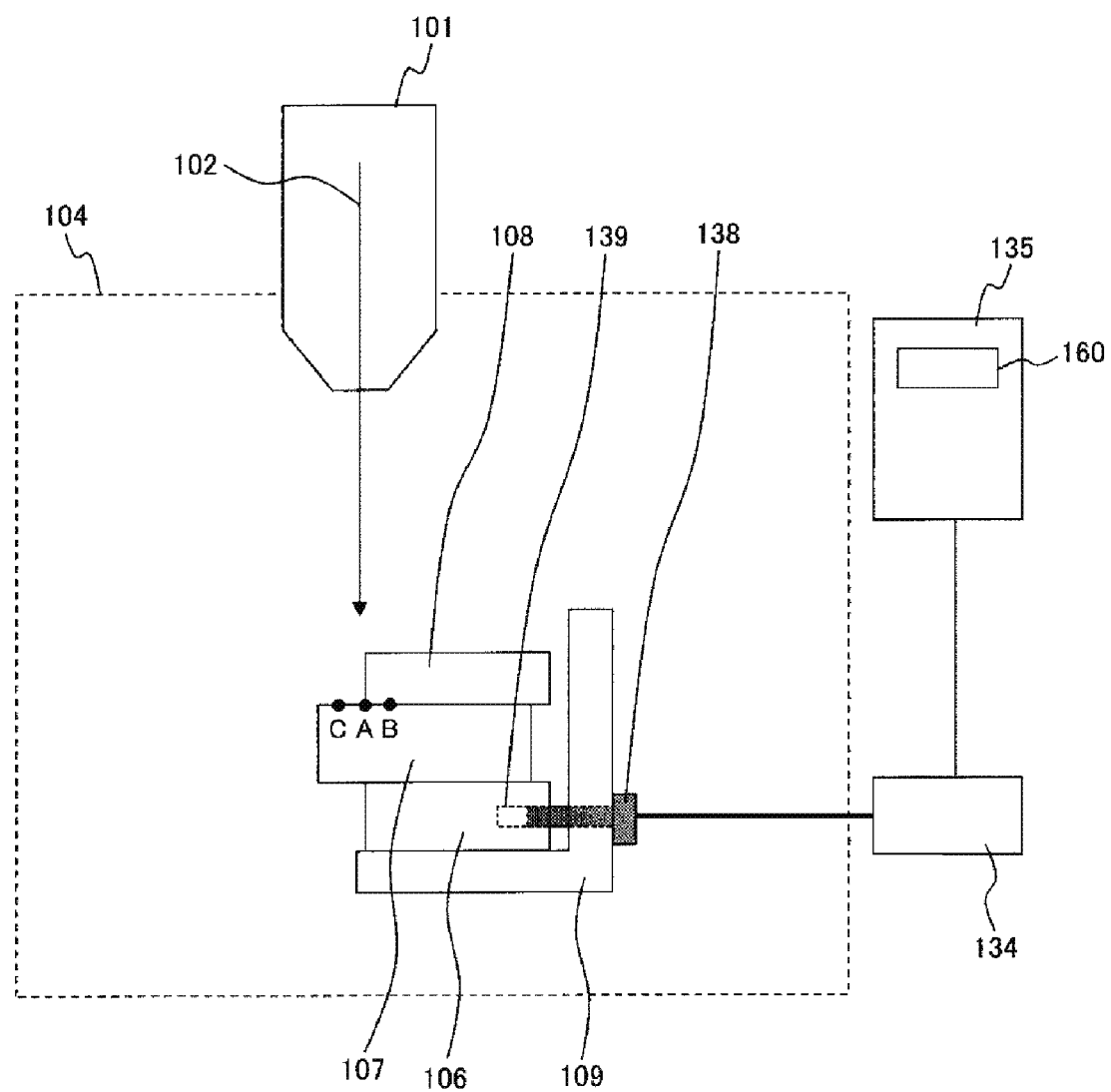
FIG. 7 is a schematic sectional view of a main part of the ion milling device illustrating an example of processing position adjustment of the sample, according to Embodiment 1.

FIG. 7 is a schematic sectional view of a main part of an ion milling device illustrating an example of processing position adjustment of a sample. The shielding plate 108, the sample 107, the sample stand 106, and the sample stage 109 are disposed inside the vacuum chamber 104. Further, the sample stand 106 is provided with a sample stand female thread portion 139, and is connected to the sample stage 109 and a screw B 138. The motor D 134 is operated under the control of the shielding plate and/or sample stand fine movement mechanism control unit 135, and the position of the sample stand 106 can be controlled by the screw B 138 being rotated.

For example, when the shielding plate 108 is initially adjusted to the processing position A illustrated on the sample 107, the energy of the ion beam 102 emitted from the ion source 101 is varied, and when the center of the ion beam 102 is changed to B on the sample 107 during processing of the sample 107, when the processing position is intentionally adjusted by the user, or the like, the motor D 134 adjusts the position of the sample stand 106 by being rotated clockwise to control the screw B 138. For the same reason as above, when the center of the ion beam 102 is changed to C on the sample 107 during processing of the sample 107, when the processing position is intentionally adjusted by the user, or the like, the motor D 134 rotates counterclockwise to control the screw B and adjust the position of the sample stand 106. Further, it is possible to precisely adjust the positions of the shielding plate 108 and the sample stand 106, using a camera, a microscope, or a monitor installed in a vacuum chamber, or a mechanism combining them.

Figure 8:
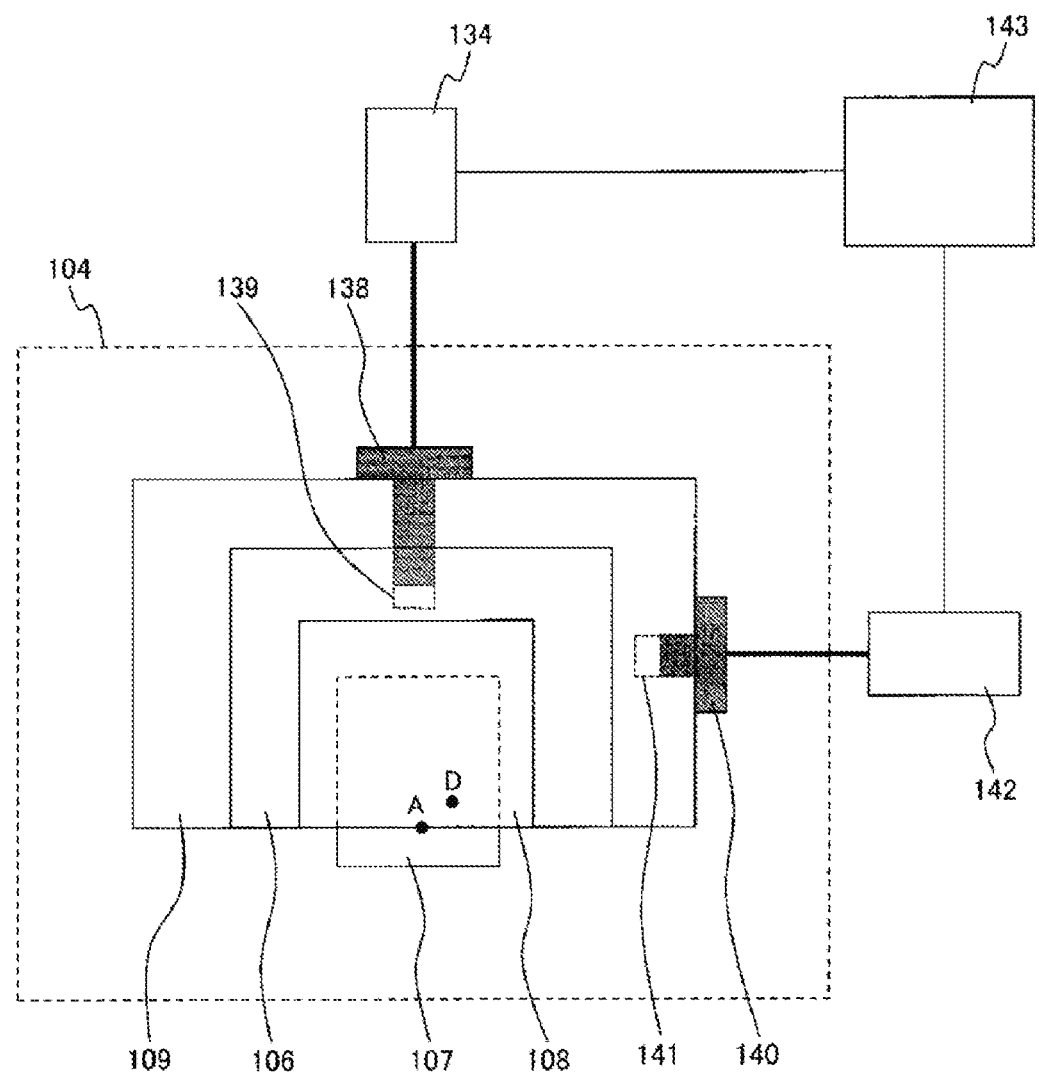
FIG. 8 is a schematic plan view of a main part of the ion milling device illustrating another example of processing position adjustment of the sample, according to Embodiment 1.

FIG. 8 is a schematic plan view of a main part of an ion milling device illustrating another example of processing position adjustment of a sample, which is a view seen from the upper part of the shielding plate 108, that is, a direction in which ions are heading to the sample 107 or the like. The shielding plate 108, the sample 107, the sample stand 106, and the sample stage 109 are disposed inside the vacuum chamber 104. The sample stand 106 is provided with a sample stand female thread portion 139, and is connected to the sample stage 109 and the screw B 138.

On the other hand, the sample stage 109 is provided with a sample stage female threaded portion 141 and is connected to a screw C 140. The motor D and motor E control unit 143 is connected to the motor D 134 and the motor E 142; rotates the screw C 140 using the motor E 142 and operates the sample stage 109 when the processing position is adjusted in the X direction in response to the instruction of the motor D and motor E control unit 143; and rotates the screw B 138 using the motor D 134 and operates the sample stand 106 in a case of adjusting the processing position in the Y direction, whereby it is possible to freely adjust the processing position in the XY direction.

For example, when the shielding plate 108 is initially adjusted to the processing position A illustrated on the sample 107, the energy of the ion beam 102 emitted from the ion source 101 is varied, and when the center of the ion beam 102 is changed to D on the sample 107 during processing of the sample 107, when the processing position is intentionally adjusted by the user, or the like, the motor D 134 adjust the position of the sample stand 106 in the Y direction by being rotated counterclockwise to control the screw B 138, and the motor E 142 adjust the position of the sample stage 109 in the X direction by being rotated counterclockwise to control the screw C 140. Here, it is also possible to perform XY adjustment of the processing position by reversing the adjustment mechanism in the X direction and the Y direction provided on the sample stand 106 and the sample stage 109. Further, it is possible to precisely adjust the positions of the shielding plate 108 and the sample stand 106, using a camera, a microscope, or a monitor installed in a vacuum chamber, or a mechanism combining them.

when a ceramic, a superhard material, or the like is used as a sample, the sample and the shielding plate is tilted with respect to the ion beam irradiation direction as illustrated in FIG. 4B, and the section processing of the sample is performed, using the ion milling device having the configuration of FIG. 4A, a good sectional shape at a predetermined position can be obtained.

As described above, according to the present embodiment, it is possible to provide a charged particle beam device capable of improving processing position accuracy even with a material with low sputtering yield, in the section processing using the shielding plate, by providing the tilt unit that relatively tilts the sample and the shielding plate with respect to the irradiation direction of the ion beam to the sample. Further, it is possible to further improve the processing position accuracy, by making the angle of tilting variable. Further, it is possible to further improve the processing position accuracy, by providing the fine movement mechanism of a shielding plate and/or a sample.

Embodiment 2

The ion milling device according to Embodiment 2 will be described with reference to FIG. 9. The matters described in Embodiment 1 and not described in the present embodiment can also be applied to the present embodiment as long as there is no particular circumstance.

Figure 9:
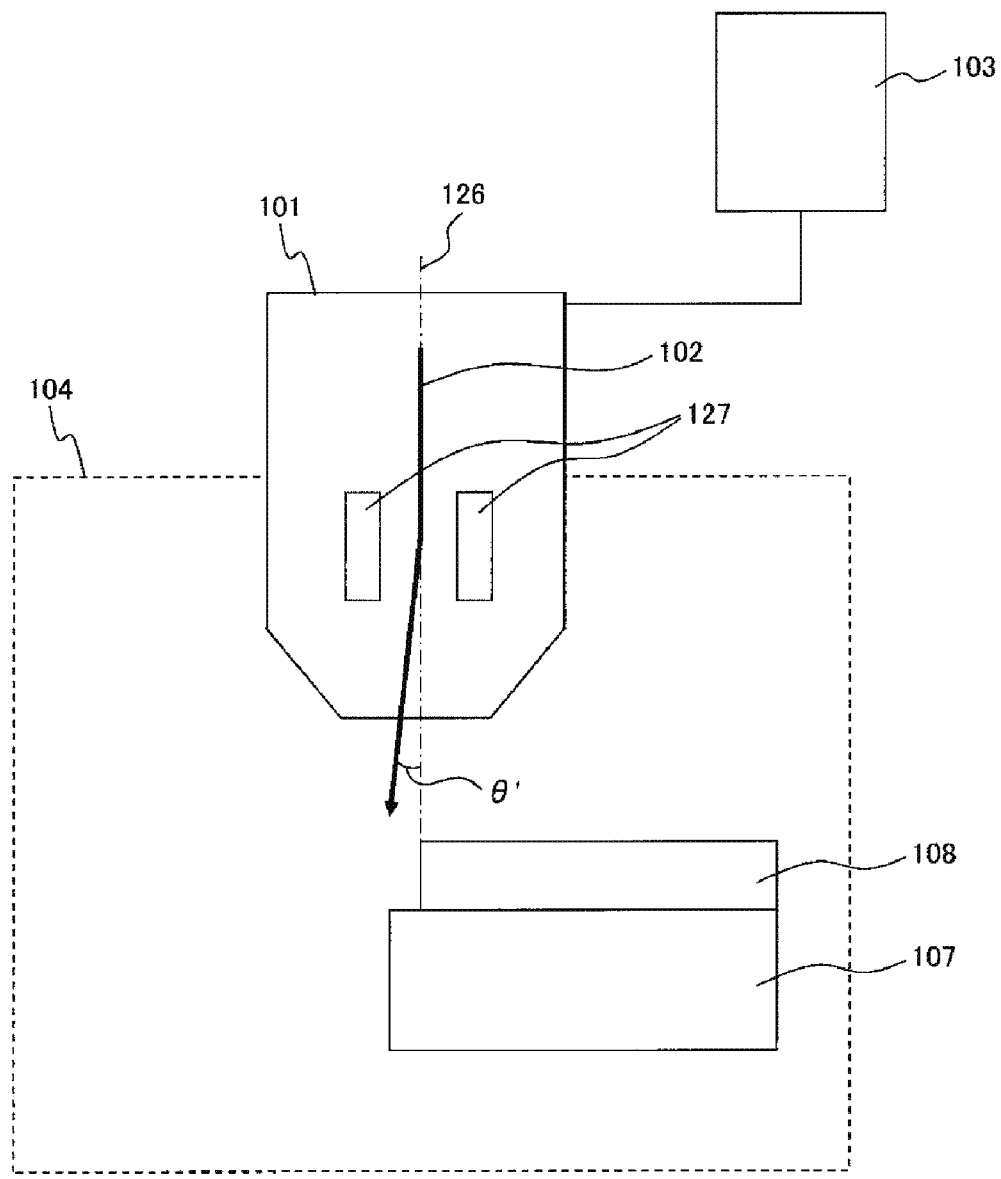
FIG. 9 is a schematic sectional view of a main part of an ion milling device including an electrostatic deflection plate, according to Embodiment 2.

FIG. 9 is a schematic sectional view of a main part of an ion milling device including an electrostatic deflection plate. The shielding plate 108 and the sample 107 are disposed inside the vacuum chamber 104. An electrostatic deflection plate 127 is disposed in the ion source 101, the ion beam 102 along the ion source center 126 is controlled by the ion source control unit 103 is curved by the electrostatic deflection plate (tilt unit) 127, and the angle of the ion beam 102 to be applied to the sample 107 can be changed. The electrostatic deflection plate can also be a deflection means using a magnetic field.

Here, as illustrated in FIG. 4B, by setting the irradiation angle θ of the ion beam 102 on the side of the shielding plate 108 with respect to the ion source center 126, it is possible to reduce the scattered ions 112 inside the sample 107 immediately below the shielding plate 108, similar to the case where the tilt axis 120 is provided at the end portion 118 of the shielding plate illustrated in FIG. 4A and the sample 107 is tilted. Therefore, the problem that the milling surface 117 illustrated in FIG. 3B is not formed perpendicular to the shielding plate 108 can be solved. Here, it is desirable that the irradiation angle θ' of the ion beam 102 is set to be greater than 0° and equal to or less than 10°, similarly to the sample tilt angle θ in FIG. 4B.

when a ceramic, a superhard material, or the like is used as a sample, the ion beam irradiation direction is tilted with respect to the sample and the shielding plate, and the section processing of the sample is performed, using the ion milling device having the configuration of FIG. 9, a good sectional shape at a predetermined position can be obtained.

As described above, according to the present embodiment, it is possible to obtain the same effect as in Embodiment 1.

Embodiment 3

The ion milling device according to Embodiment 3 will be described with reference to FIG. 10. The matters described in Embodiment 1 or 2 and not described in the present embodiment can also be applied to the present embodiment as long as there is no particular circumstance.

Figure 10:
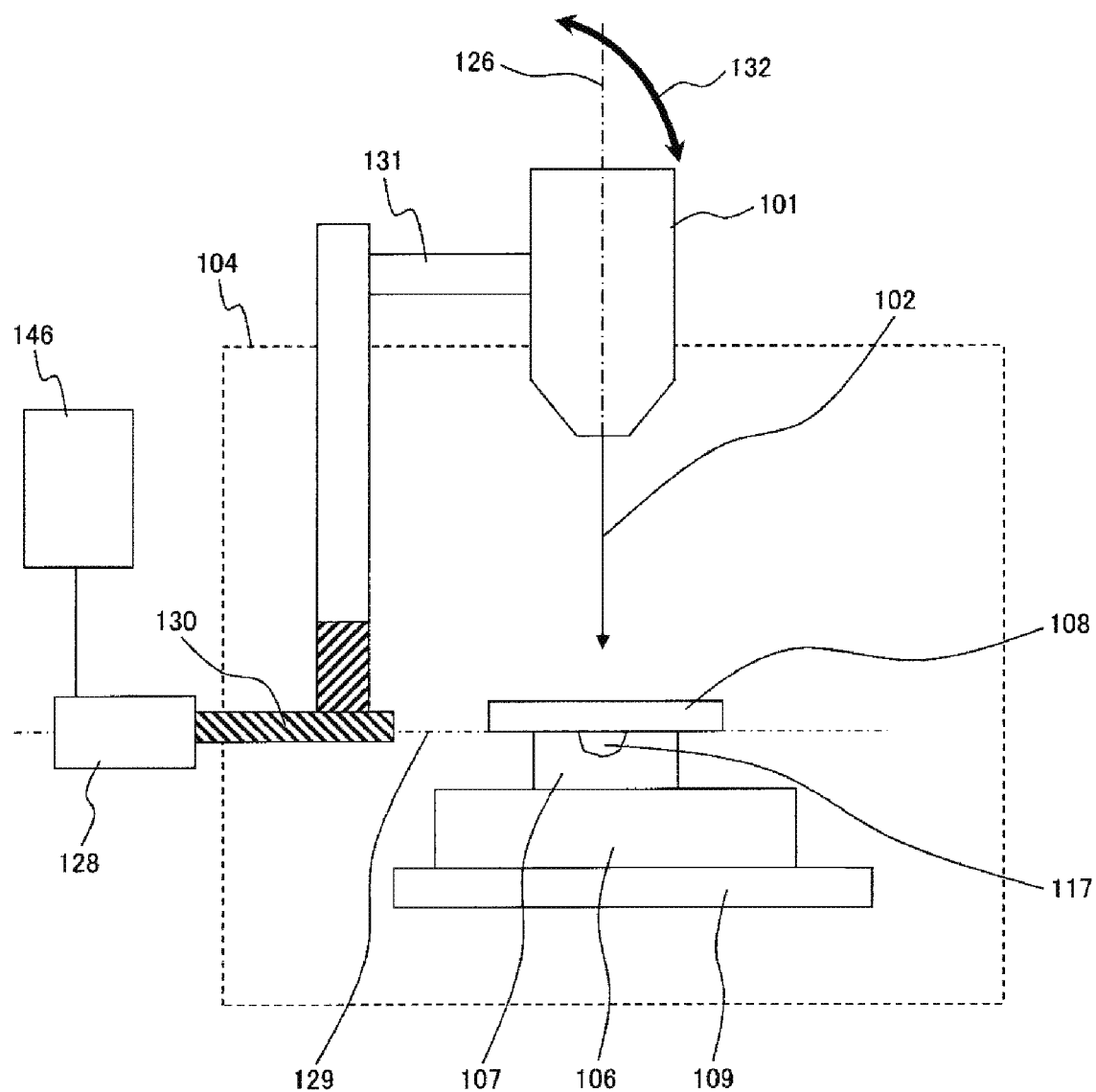
FIG. 10 is a schematic sectional view of a main part of an ion milling device having a tilt mechanism of an ion source, according to Embodiment 3.

FIG. 10 is a schematic sectional view of a main part of an ion milling device having a tilt mechanism of an ion source. The shielding plate 108, the sample 107, the sample stand 106, and the sample stage 109 are disposed inside the vacuum chamber 104. Further, the ion source 101 is connected to a worm gear (a part of the tilt unit) 130 through an arm (a part of the tilt unit) 131, and is constituted to be interlocked with a motor B (a part of the tilt unit) 128 controlled by the motor B control unit (a part of the tilt unit) 146 The motor B control unit 146 sets the angle to an any angle, and the ion source 101 or the ion source center 126 is tilted around the motor B rotation center axis 129, through the motor B 128, the worm gear 130, and the arm 131, as illustrated in an ion source driving direction 132. In this way, similar to the case illustrated in FIG. 9, in the ion source 101, by setting the irradiation angle θ greater than 0° and equal to or less than 10° on the side of the shielding plate 108, the problem that the milling surface 117 illustrated in FIG. 3B is not formed perpendicular to the shielding plate 108 can be solved.

when a ceramic, a superhard material, or the like is used as a sample, the ion beam irradiation direction is tilted with respect to the sample and the shielding plate, and the section processing of the sample is performed, using the ion milling device having the configuration of FIG. 10, a good sectional shape at a predetermined position can be obtained.

As described above, according to the present embodiment, it is possible to obtain the same effect as in Embodiment 1.

The present invention includes the following embodiments.

A charged particle beam device including:
an ion source;
a sample stand on which a sample is placed;
a shielding plate disposed such that a portion of the sample is exposed when seen from the ion source;
a swing unit that swings the sample and the shielding plate around a swing axis which is orthogonal to a direction in which an end portion of the shielding plate on a side on which apart of the sample is exposed extends and intersects an ion beam from the ion source; and
a tilt unit that relatively tilts the sample and the shielding plate by a tilt angle θ with respect to the irradiation direction of the ion beam to the sample, in a direction in which the sample is shielded by the shielding plate, around a tilt axis which is set in the end portion of the shielding plate so as to be orthogonal to the swing axis and to intersect the ion beam.

It should be noted that the present invention is not limited to each of the above-described embodiments, and various modification examples are included. For example, the above-described embodiments have been described in detail in order to explain the present invention in an easy-to-understand manner and are not necessarily limited to those having all the configurations described. In addition, some of the configurations of certain embodiments may be replaced with the configuration of the other embodiments, and it is also possible to add configurations of other embodiments to the configurations of certain embodiments. Further, with respect to a part of the configuration of each of the embodiments, addition, deletion, and replacement of another configuration can be performed.

REFERENCE SIGNS LIST

101: ion source
102: ion beam
103: ion source control unit
104: vacuum chamber
105: vacuum evacuation system
106: sample stand
107: sample
108: shielding plate
109: sample stage
110: argon ion
111: argon ion incident direction
112: scattered ion
113: protrusion amount
114: swing axis
115: swing (direction)
116: beam center
117: milling surface
118: end portion of shielding plate
119: fine structure
120: tilt axis
121: tilt driving direction
122: fine movement of shielding plate
123: tilt control unit
124: motor A (part of tilt unit)
125: motor A rotation center axis
126: ion source center
127: electrostatic deflection plate
128: motor B (part of tilt unit)
129: motor B rotation center axis
130: worm gear (part of tilt unit)
131: arm (part of tilt unit)
132: ion source driving direction
133: motor C
134: motor D
135: shielding plate and/or sample stand fine movement mechanism control unit
136: screw A
137: shielding plate female thread portion
138: screw B
139: sample stand female thread portion
140: screw C
141: sample stage female thread portion
142: motor E
143: control units of motor D and motor E
146: control unit of motor B
160: memory

The invention claimed is:

1. A charged particle beam device comprising:
an ion source adapted to generate an ion beam having an ion beam center;
a sample stage on which a sample is placed for section milling a section surface of the sample, using the ion beam;
a shielding plate that is disposed on the sample stage between the ion source and the sample such that a portion protrusion amount of the sample is exposed to the ion beam for section milling of the protrusion amount of the sample, when that protrusion amount of the sample extends beyond an end portion of the shielding plate and is seen from the ion source;
a sample movement mechanism and a shielding plate movement mechanism, whereby the sample and the shielding plate are movable independently with respect to each other, the sample movement mechanism and the shielding plate movement mechanism including a fine movement control unit that finely moves the shielding plate respective to the sample stand such that an exposure amount of the sample can be finely adjusted, as viewed from the ion source, in accordance with an accelerator voltage of the ion beam;
a sample stage tilt unit, which sample stage tilt unit tilts the sample and the shielding plate about a tilt angle θ, around a tilt axis, which tilt axis is orthogonal to, and which intersects the ion beam from the ion source at a point of contact between the protrusion amount of the sample and the end portion of the shielding plate, which tilt axis extends in a direction whereby, on rotation of the sample stage about the tilt axis, the end portion of the shielding plate, from which end portion of the shielding plate the protrusion amount of the sample extends, masks a part of the protrusion amount of the sample extending beyond the end portion of the shielding plate, with respect to the ion beam;

a swing unit that swings the sample and the shielding plate around a swing axis, which swing axis is orthogonal to the tilt axis and intersects the ion beam; and whereby, the provision of the tilt axis at the end portion of the shielding plate using the fine movement control unit allows a change in the tilt angle ⊖, to change an angle of the ion beam entering the sample, to form a milling surface in the sample which milling surface is perpendicular to the shielding plate.

2. The charged particle beam device according to claim 1, wherein
the tilt unit includes a mechanical mechanism that varies the tilt angle θ relative to an irradiation direction of the ion beam to the sample.

3. The charged particle beam device according to claim 2, wherein
the tilt angle is variable on a side of the shielding plate with respect to the irradiation direction of the ion beam to the sample in a range between 0° and 10°.

4. The charged particle beam device according to claim 2, wherein
the mechanical mechanism further includes a tilt mechanism that tilts the ion source.

5. The charged particle beam device according to claim 2, wherein
the mechanical mechanism further includes a tilt mechanism that tilts a sample stage on which the sample stand is installed.

6. The charged particle beam device according to claim 1, wherein
the sample stand tilt unit further includes an ion beam deflecting plate that varies the tilt angle θ relative to the irradiation direction of the ion beam to the sample.

7. The charged particle beam device according to claim 6, wherein
the tilt angle θ is variable on a side of the shielding plate with respect to the irradiation direction of the ion beam to the sample in a range between 0° and 10°.

8. The charged particle beam device according to claim 1, wherein
the fine movement mechanism is controlled using a relationship between the energy of the ion beam and a position of the sample stand with respect to the shielding plate, which relationship is stored in advance.

9. The charged particle beam device according to claim 1, wherein
the fine movement mechanism is manually adjustable, based on information obtained by one of a camera, a microscope, a monitor, and a combination thereof.

10. A charged particle beam device comprising:
an ion source adapted to generate an ion beam having an ion beam center;
a sample stand on which a sample is placed for section milling a section surface of the sample using the ion beam;
a shielding plate that is disposed between the ion source and the sample such that a protrusion amount of the sample is exposed to the ion beam for section milling of the protrusion amount of the sample when that exposed protrusion amount of the sample is seen from the ion source;
a sample movement mechanism and a shielding plate movement mechanism, whereby the sample and the shielding plate are movable independently with respect to each other, the sample movement mechanism and the shielding plate movement mechanism including a fine movement control unit that finely moves the shielding plate respective to the sample stand such that an exposure amount of the sample can be finely adjusted, as viewed from the ion source, in accordance with an accelerator voltage of the ion beam;
a swing unit that swings the sample and the shielding plate around a swing axis which swing axis is orthogonal to a direction in which an end portion of the shielding plate, on a side of which end portion a part of the sample is exposed, extends and intersects the ion beam from the ion source;
a sample stage tilt unit, which sample stage tilt unit tilts the sample and the shielding plate about a tilt angle θ, around a tilt axis, which tilt axis is orthogonal to, and which is set in a direction in which the end portion of the shielding plate extends so as to be orthogonal to the swing axis and to intersect the ion beam, in a direction in which a part of the protrusion amount the sample, extending beyond the end face of the shielding plate, is masked by the shielding plate with respect to an irradiation direction of the ion beam to the sample; and
whereby, the provision of the tilt axis at the end portion of the shielding plate using the fine movement control unit allows a change in the tilt angle ⊖, to change an angle of the ion beam entering the sample, to form a milling surface in the sample which milling surface is perpendicular to the shielding plate.

11. The charged particle beam device according to claim 10, wherein
the tilt angle θ is variable in a range of between 0° and 10°.

* * * * *